(12) United States Patent
Manning

(10) Patent No.: US 6,188,613 B1
(45) Date of Patent: Feb. 13, 2001

(54) DEVICE AND METHOD IN A SEMICONDUCTOR MEMORY FOR ERASING/PROGRAMMING MEMORY CELLS USING ERASE/PROGRAM SPEEDS STORED FOR EACH CELL

(75) Inventor: H. Montgomery Manning, Kuna, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/168,705

(22) Filed: Oct. 8, 1998

(51) Int. Cl.$^7$ ................................................. G11C 16/04
(52) U.S. Cl. ......................... 365/185.33; 365/49; 365/52
(58) Field of Search ............................ 365/189.01, 218, 365/189.04, 185.14, 185.33, 45, 52, 185.29, 49; 326/38; 395/425, 430, 182.21

(56) References Cited

U.S. PATENT DOCUMENTS

| | | |
|---|---|---|
| 5,089,867 | 2/1992 | Lee . |
| 5,305,263 | 4/1994 | Morgan . |
| 5,313,433 | 5/1994 | Waller . |
| 5,345,104 | 9/1994 | Prall et al. . |
| 5,357,463 | 10/1994 | Kinney . |
| 5,369,616 | 11/1994 | Wells et al. . |
| 5,376,573 | 12/1994 | Richart et al. . |
| 5,424,993 | 6/1995 | Lee et al. . |
| 5,469,557 * | 11/1995 | Salt et al. ............................. 395/425 |
| 5,485,422 | 1/1996 | Bauer et al. . |
| 5,508,959 | 4/1996 | Lee et al. . |
| 5,513,137 | 4/1996 | Lee et al. . |
| 5,518,942 | 5/1996 | Shrivastava . |
| 5,539,690 | 7/1996 | Talreja et al. . |
| 5,559,742 | 9/1996 | Lee et al. . |
| 5,559,957 * | 9/1996 | Balk ............................... 395/182.21 |
| 5,619,454 | 4/1997 | Lee et al. . |
| 5,633,823 | 5/1997 | Lee . |
| 5,650,734 * | 7/1997 | Chu et al. .............................. 326/38 |
| 5,671,388 * | 9/1997 | Hasbun ................................ 395/430 |
| 5,680,350 | 10/1997 | Lee . |
| 5,712,815 | 1/1998 | Bill et al. . |
| 5,729,489 | 3/1998 | Fazio et al. . |

* cited by examiner

Primary Examiner—Viet Q. Nguyen
Assistant Examiner—Thong Le
(74) Attorney, Agent, or Firm—Trask Britt

(57) ABSTRACT

In a flash memory, flash cells are paired off so each pair includes a memory cell for storing data and a query cell for storing a characteristic analog value representative of the erase or programming speed of the memory cell. To erase a memory cell, the value stored in the query cell with which it is associated is retrieved, the current state of the memory cell is read, and an erase pulse having a pulse width (or amplitude) that is a function of the value retrieved from the query cell and the current state of the memory cell is then sent to the memory cell to erase it. To program a data bit into a memory cell, the value stored in the query cell with which it is associated is retrieved, and a programming pulse having a pulse width that is a function of the data bit and the value retrieved from the query cell is then to the memory cell to program it. Because the value stored in each query cell is characteristic of the particular memory cell with which the query cell is associated, the erase or programming pulse sent to the memory cell is highly accurate and, hence, is unlikely to over-erase or over-program the memory cell. As a result, the time-consuming verification steps required by most conventional flash memories are eliminated.

48 Claims, 2 Drawing Sheets

DEVICE AND METHOD IN A SEMICONDUCTOR MEMORY FOR ERASING/PROGRAMMING MEMORY CELLS USING ERASE/PROGRAM SPEEDS STORED FOR EACH CELL

BACKGROUND OF THE INVENTION

1. Technical Field

This invention relates in general to semiconductor memories and, more specifically, to devices and methods for erasing or programming memory cells in a semiconductor memory according to erase or program speeds, or other erase or program characteristics, stored for each memory cell in a "query" cell associated with each memory cell. This invention is particularly applicable to flash memories, Erasable Programmable Read Only Memories (EPROMs), and Electrically Erasable PROMs (EEPROMs), among others.

2. State of the Art

As shown in FIG. 1, a typical flash EEPROM cell 10 has two states, "programmed" and "erased." The flash EEPROM cell 10 is programmed using hot electron injection, for example, by grounding a source 12, energizing a drain 14 at 6.0 volts, and activating a wordline 16 at 12.0 volts. Under these conditions, a tapered channel 18 is induced between the source 12 and drain 14, allowing electrons to pass from the source 12, through the channel 18, and to the drain 14. Because of a strong electric field formed in the channel 18 as a result of the 6.0 volt source-drain differential, some electrons passing through the channel 18 are deflected upward and injected into a floating gate 20 through a gate oxide layer 22. These injected electrons remain on the floating gate 20 as a non-volatile negative charge representative of a "0" bit, for example.

The flash EEPROM cell 10 is erased using Fowler-Nordheim tunneling, for example, by energizing the source 12 at 12.0 volts, grounding the wordline 16, and allowing the drain 14 to float. Under these conditions, electrons stored on the floating gate 20 tunnel through the gate oxide layer 22 and are swept into the source 12. This causes a partial depletion of negative charge on the floating gate 20 representative of a "1" bit, for example.

It should be noted that programming the flash EEPROM cell 10 increases its threshold voltage $V_T$, because the negative charge stored on the floating gate 20 tends to repel electrons, and this, in turn, makes it necessary to apply a relatively high wordline voltage to the wordline 16 to induce the channel 18. In contrast, erasing the flash EEPROM cell 10 decreases its threshold voltage $V_T$, because the depletion of negative charge on the floating gate 20 allows a relatively low wordline voltage applied to the wordline 16 to induce the channel 18.

The state of the flash EEPROM cell 10 is typically read by applying a wordline voltage of 5.0 volts, for example, to the wordline 16. If the flash EEPROM cell 10 has been programmed, the 5.0 volt wordline voltage is insufficient to induce the channel 18, so no current flows between the source 12 and the drain 14. In contrast, if the flash EEPROM cell 10 has been erased, the 5.0 volt wordline voltage is sufficient to induce the channel 18, so current does flow between the source 12 and the drain 14. The state of the flash EEPROM cell 10 (i.e., is it a "1" bit or a "0" bit?) can then be determined by observing the presence or absence of current flow through the flash cell 10.

The process described above for programming and erasing the flash EEPROM cell 10 is a somewhat simplified description of what actually occurs. In practice, it is possible to "over-erase" the flash EEPROM cell 10, such that the floating gate 20 has a neutral or even slightly positive charge to it. If this occurs, the over-erased flash EEPROM cell 10 is always on. Because multiple flash cells are generally connected to a common digit line used for reading their state, a flash cell 10 that is always on can cause programmed flash EEPROM cells connected to the same digit line to be misread as erased flash cells. Accordingly, the flash EEPROM cell 10 is generally erased in incremental steps by erasing a small amount of charge from the flash EEPROM cell 10, verifying the state of the flash EEPROM cell 10 by reading its state, and, if the flash EEPROM cell 10 is still in a programmed state, repeating the erasure and verification steps. This process continues until the erasure of the flash cell 10 is verified. In this way, over-erasure of the flash EEPROM cell 10 is avoided.

When programming the flash EEPROM cell 10, verification is generally not required, because the process of programming by hot electron injection is self-limiting. Specifically, as the floating gate 20 takes on more and more negative charge during programming, the negative charge tends to disrupt the field created by the 6.0 volt differential between the source 12 and the drain 14 until, at some point, hot electron injection from the channel 18 to the floating gate 20 is no longer possible.

However, unlike the flash EEPROM cell 10, some flash cells are multi-bit cells, which means they have more than one programmed state in addition to their erased state. Such multi-bit cells, instead, have multiple programmed states in addition to their erased state. For example, a multi-bit cell may have states such as those summarized in the following table.

TABLE 1

| $V_T$ (volts) | Binary State of Flash Cell |
|---|---|
| 1.5 to 3.0 | 00 (erased) |
| 3.5 to 4.0 | 10 (programmed) |
| 4.5 to 5.0 | 10 (programmed) |
| 5.5 to 7.0 | 11 (programmed) |

In such multi-bit flash cells, it is possible to overshoot a desired programmed state by injecting too much charge into the floating gate 20. Accordingly, verification is typically used when programming such multi-bit cells to ensure that overshoot is avoided and that the cells are programmed as desired.

Unfortunately, the verification process described above, whether used in erasing or programming flash cells, tends to add a considerable amount of delay to the process of erasing or programming such cells. In fact, delay due to the time requirements of the verification process is the principal reason conventional flash EEPROMs are generally considered to be too slow for memory applications requiring fast access.

Accordingly, a variety of methods have been developed for limiting the access-time delay associated with verification during erasure or programming of flash cells. In one such method disclosed in U.S. Pat. No 5,712,815 to Bill et al., programming and verification occur at the same time, so as to eliminate the time-consuming process of switching from a relatively high voltage programming step to a separate low-voltage verification step (i.e., the process of verification involves reading the flash cells, which is a relatively low-voltage operation). Unfortunately, the Bill et al. method requires the addition of some relatively complex circuitry, and it does not eliminate the need for verification during erasure or programming but, instead, merely masks it with the programming step. In another method, disclosed in U.S. Pat. No. 5,729,489 to Fazio et al., adaptive learning techniques are used during programming to "learn" the threshold voltage $V_T$ programming characteristics of a representative flash cell, and these programming characteristics are then used to program other flash cells without verification. This method also requires the addition of some relatively complex circuitry, and suffers from the inaccuracies inherent in applying the programming characteristics of a representative flash cell to the process of programming other flash cells that may not have the same programming characteristics.

Therefore, there is a need in the art for an improved device and method for erasing or programming flash and other memory cells. Such a device and method should avoid the problems described above that are associated with previous methods.

SUMMARY OF THE INVENTION

An inventive system for changing the state of a memory cell (e.g., a flash cell) includes a query cell (e.g., another flash cell) that stores a value (e.g., a charge) representative of a characteristic rate of change in the state of the memory cell. The value may be, for example, an erasure or programming speed of the memory cell. When the state of the memory cell is to be changed (e.g., the memory cell is to be erased or programmed), querying circuitry retrieves the value stored in the query cell, and state change circuitry changes the state of the memory cell in accordance with the value retrieved from the query cell. The state change circuitry may change the state of the memory cell by, for example, sending an erasure or programming pulse to the memory cell, with the pulse width or amplitude of the pulse being determined by the value retrieved from the query cell. If the memory cell is being erased, then the pulse width or amplitude of the erasure pulse is also dependent on the state of the memory cell prior to its erasure. Also, if the memory cell is a multi-bit memory cell that is being programmed, then the pulse width or amplitude of the programming pulse is also dependent on the data to be programmed into the memory cell.

In other embodiments of this invention, the system described above is incorporated into an embedded memory of a semiconductor device, a multi-bit per cell memory device, a flash memory, an electronic system, and a semiconductor substrate, such as a semiconductor wafer.

In another embodiment of this invention, a memory array includes a plurality of memory cells and a plurality of query cells. Each query cell is associated with one of the memory cells and stores a value representative of a characteristic rate of change in the state of its associated memory cell.

In a method of erasing a memory cell in accordance with this invention, a value representative of a characteristic rate of erasure of the memory cell is stored in a query cell associated with the memory cell. To erase the memory cell, the value stored in the query cell is retrieved, and the state of the memory cell is read. The memory cell is erased in accordance with the state thereof and the value retrieved from the query cell.

In a method of programming a memory cell with a selected data bit in accordance with this invention, a value representative of a characteristic rate of programming of the memory cell is stored in a query cell associated with the memory cell. To program the memory cell, the value stored in the query cell is retrieved, and the memory cell is programmed in accordance with the selected data bit and the value retrieved from the query cell.

In a method of storing a characteristic rate of change in the state of a memory cell located in a memory device in accordance with this invention, a value representative of the characteristic rate of change in the state of the memory cell is stored in a query cell that is associated with the memory cell and is also located in the memory device.

DETAILED DESCRIPTION OF THE ILLUSTRATED EMBODIMENTS

Figure 1:
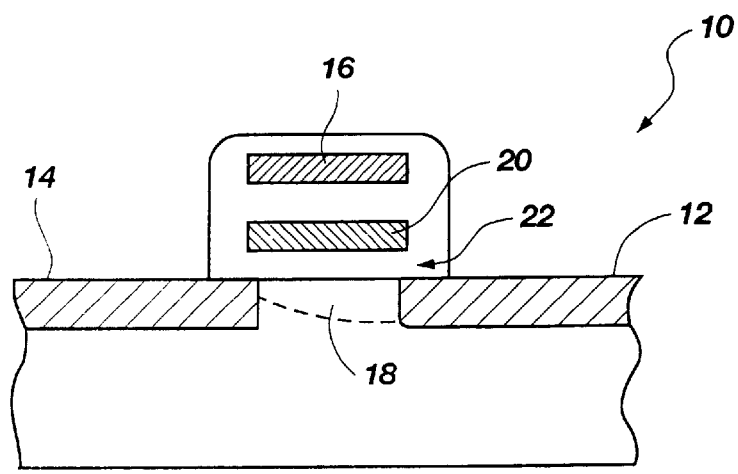
FIG. 1 is a sectional view of a conventional flash memory cell.
Figure 2:
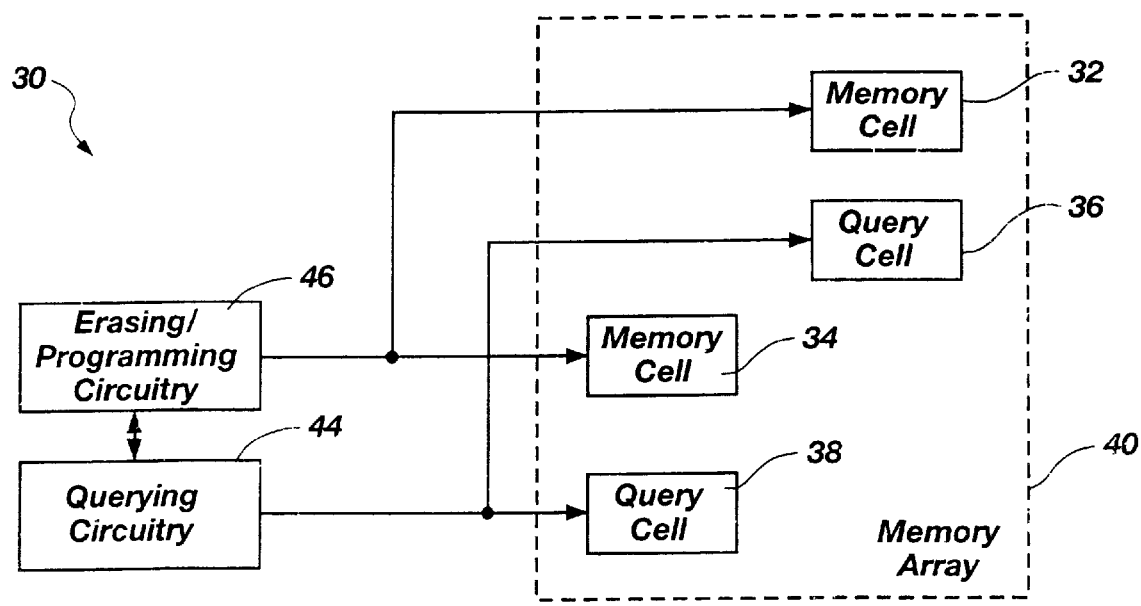
FIG. 2 is a block diagram of a system in accordance with this invention for programming and erasing memory cells in a memory array.

As shown in FIG. 2, a portion 30 of a memory device 50 (shown in FIG. 3), in accordance with this invention, includes multi-bit memory cells 32 and 34 paired with query cells 36 and 38, respectively, in a memory array 40. "Query cell," as used herein, means a cell associated with a memory cell for the purpose of storing a characteristic rate of change in state, such as the erasure or programming speed, of the memory cell.

Figure 3:
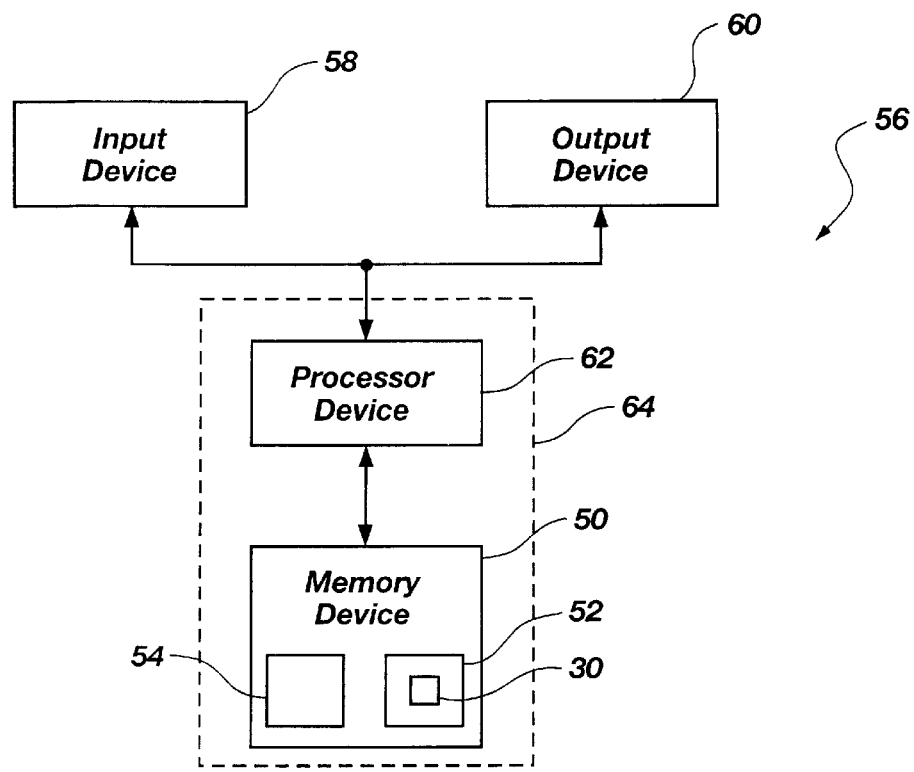
FIG. 3 is a block diagram of an electronic system incorporating the programming and erasing system of FIG. 2.

It will be understood by those having skill in the technical field of this invention that the memory device 50 of FIG. 3 (only a portion 30 of which is shown in FIG. 2) can be, for example, a flash EEPROM, a standard EEPROM, an EPROM, a PROM, a Dynamic Random Access Memory (DRAM), an embedded memory, a memory device that uses Fowler-Nordheim tunneling for programming (rather than hot electron injection), or any other memory device. It will also be understood that the memory array 40 shown in FIG. 2 may, in reality, comprise two or more sub-arrays, and that the memory cells 32 and 34 and their respective query cells 36 and 38 may all be located in the same sub-array, or in different sub-arrays. Further, although the memory cells 32 and 34 will be described herein as being multi-bit cells, it will be understood that the memory cells 32 and 34 may instead comprise single-bit cells.

In addition, although the memory cells 32 and 34 and the query cells 36 and 38 are shown in FIG. 2 as being in a one-to-one correspondence with one another, it will be understood that this invention includes within its scope implementations in which one query cell is associated with multiple memory cells and stores an average or mean erasure or programming speed for all of the memory cells with which it is associated. Such alternative implementations do not reduce the risk that over-erasure or programming overshoot may occur by as much as the described implementation in which a one-to-one correspondence exists, but this may be acceptable in some applications.

The query cells 36 and 38 store analog values representative of the erasure or programming speed of their respective memory cells 32 and 34. These analog values are determined by external probe circuitry 42 (shown in FIG. 4), or by internal circuitry, such as querying circuitry 44, and are programmed into the query cells 36 and 38 by the querying circuitry 44 using the conventional verification procedures described above. The querying circuitry 44 may also periodically redetermine and reset the analog values during field use using these conventional verification procedures. Of course, it will be understood that the query cells 36 and 38 may store digital values instead of analog values.

Also, the memory cells 32 and 34 are initially placed in their erased state using state change circuitry, such as erasing/programming circuitry 46, that operates in accordance with the conventional verification procedures described above. The erasing/programming circuitry 46 may also periodically reset the memory cells 32 and 34 to their erased state during field use using these conventional verification procedures, but routine programming or erasing occurs without the need for verification, as will now be described.

If the query cell 36 stores an erasure speed value, for example, of the memory cell 32, then the memory cell 32 can be erased as follows. The querying circuitry 44 retrieves the erasure speed value from the query cell 36, and the erasing/programming circuitry 46 then reads the state of the memory cell 32. Then, the erasing/programming circuitry 46 sends an erase pulse to the memory cell 32, with the pulse width of the erase pulse being determined by the erasure speed value retrieved from the query cell 36 and the current state of the memory cell 32. This erase pulse then erases the memory cell 32 to its erased state without the usual need for verification to prevent over-erasure.

An example may help illustrate this. Suppose, for example, that the memory cell 32 has an erased state and three programmed states. If the memory cell 32 is determined to be in its second programmed state prior to erasure, then the pulse width of the erase pulse may be determined to be two-thirds of the width required for full erasure from the third programmed state, as determined by the erasure speed value retrieved from the query cell 36. Similarly, if the memory cell 32 is determined to be in its erased state already, then the pulse width of the erase pulse may be determined to be zero.

If, instead, the query cell 36 stores a programming speed value, for example, of the memory cell 32, then the memory cell 32 can be programmed as follows. The querying circuitry 44 retrieves the programming speed value from the query cell 36. Then, the erasing/programming circuitry 46 sends a programming pulse to the memory cell 32, with the pulse width of the programming pulse being determined by the programming speed value retrieved from the query cell 36 and the data bit to be programmed into the memory cell 32. This programming pulse then programs the memory cell 32 to the appropriate programmed state without the usual need for verification to prevent overshoot.

An example may help illustrate this. Suppose, for example, that the memory cell 32 again has an erased state (corresponding to a "00" digital value) and three programmed states (corresponding to "01," "10, " and "11" digital values). If the memory cell 32 is to be programmed with a "10" digital value (i.e., to its second programmed state), then the pulse width of the programming pulse may be determined to be two-thirds of the width required for full programming to the third programmed state, as determined by the programming speed value retrieved from the query cell 36.

In alternative embodiments of this invention, the voltage amplitude of the erase or programming pulses described above, rather than the pulse width of these pulses, can be controlled in accordance with values stored in query cells. In addition, although the process of programming or erasing using query cells is described above as being sequential, it need not be. For example, an erase or programming pulse may be initiated before or while a query cell is "queried." It is preferable under these circumstances, of course, for the erase or programming speed to be retrieved from the query cell before the trailing edge of the pulse must be generated.

Further, the process described above for erasing memory cells concludes with the cells being erased to a "00" or "erased" state. Similarly, the process described above for programming memory cells relies on the fact that the cells are initially in a "00" or "erased" state. In another alternative embodiment of this invention, memory cells are programmed from one state to the next without the intermediate step of being brought to a "00" or "erased" state. For example, the erasing/programming circuitry 46 of FIG. 2 can program or erase the memory cell 34 from one state (e.g., the "01" state) to another state (e.g., the "11" state) by generating an erase or programming pulse in accordance with the value retrieved from the query cell 38, the current state of the memory cell 34 (e.g., the "01" state), and the data bit or bits (e.g., "11") to be programmed into the memory cell 34.

Because this invention allows for the elimination of conventional verification steps during erasure and programming, it dramatically improves the speed with which flash and other memories can be erased and/or programmed. Also, the accuracy inherent in this inventive system for erasing and/or programming memory cells provides a better distribution of programmed states within multi-bit memory cells, which allows for a better yield in memory devices containing such cells. Further, this inherent accuracy also improves the density (i.e., the number of bits per cell) that can be provided in a memory device.

As shown in FIG. 3, the portion 30 of the memory device 50 is located in one of at least two sub-arrays 52 and 54 of the memory device 50. Also, an electronic system 56 of this invention includes an input device 58, an output device 60, and a processor device 62, as well as the memory device 50. Further, the memory device 50 is shown as being embedded in a semiconductor device 64 along with the processor device 62, although embodiments of this invention in which the memory device 50 is not embedded in a semiconductor device with the processor device 62, or any other logic circuitry, are also within the scope of the invention.

Figure 4:
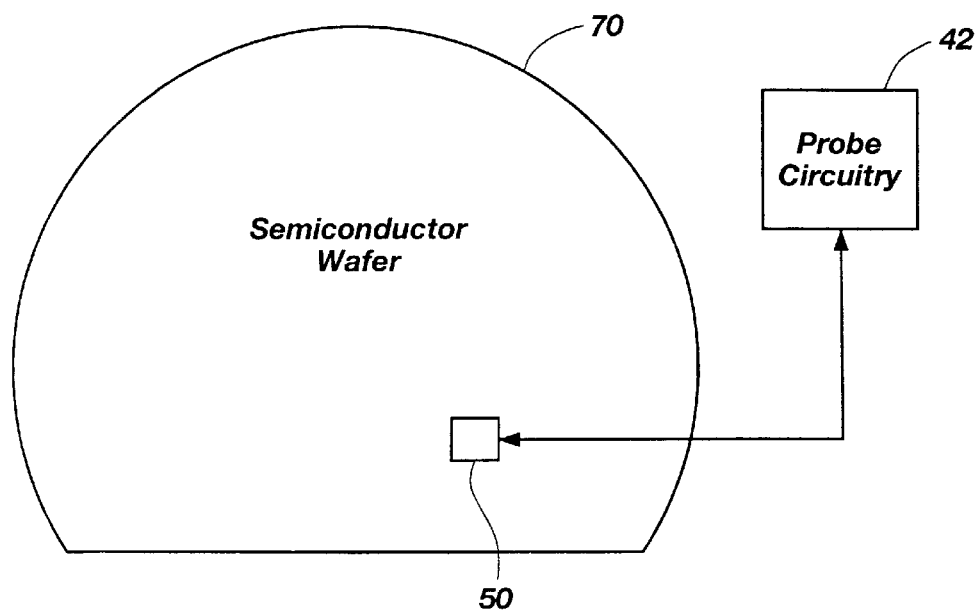
FIG. 4 is a diagram of a semiconductor wafer on which the system of FIG. 2 is fabricated.

As shown in FIG. 4, the memory device 50 is fabricated on the surface of a semiconductor wafer 70 made of Silicon or Gallium-Arsenide, for example, in accordance with this invention. Of course, it should be understood that the memory device 50 may be fabricated on semiconductor substrates other than a wafer, such as a Silicon-on-Insulator (SOI) substrate, a Silicon-on-Glass (SOG) substrate, and a Silicon-on-Sapphire (SOS) substrate.

Although this invention has been described with reference to particular embodiments, the invention is not limited to these described embodiments. Rather, the invention is limited only by the appended claims, which include within their scope all equivalent devices and methods that operate according to the principles of the invention as described.

What is claimed is:

1. A system for changing the state of a memory cell, the system comprising:

a query cell for storing a value representative of a characteristic rate of change in the state of the memory cell;

querying circuitry coupled to the query cell for retrieving the value stored therein; and state change circuitry coupled to the querying circuitry for changing the state of the memory cell in accordance with the value retrieved from the query cell.

2. The system of claim 1, wherein the query cell is selected from a group comprising a flash cell, an EEPROM cell, an EPROM cell, a PROM cell, a DRAM cell, a multi-bit cell, a cell that is programmed using Fowler-Nordheim injection, and an embedded-memory cell.

3. The system of claim 1, wherein the query cell is constructed to store a charge representative of one of a characteristic erasure speed and a characteristic programming speed of the memory cell.

4. The system of claim 1, wherein the query cell is constructed to store a value representative of an average rate of change in the state of the memory cell and in states of one or more other memory cells.

5. The system of claim 1, wherein the state change circuitry comprises circuitry for reading the state of the memory cell and changing said state in accordance with the value retrieved from the query cell and the state read from the memory cell.

6. The system of claim 1, wherein the state change circuitry comprises one of erasing circuitry and programming circuitry.

7. The system of claim 1, wherein the querying circuitry include s circuitry for programming the value into the query cell by programming the query cell in increments and verifying the value stored in the query cell after each programming increment.

8. The system of claim 7, wherein the querying circuitry further includes circuitry for determining the value to be stored in the query cell.

9. The system of claim 1, wherein the memory cell, query cell, querying circuitry, and state change circuitry are located in a memory device, wherein the system further comprises probe circuitry external to the memory device for determining the value to be stored in the query cell.

10. The system of claim 1, wherein the state change circuitry includes circuitry for outputting one of an erase pulse and a programming pulse to the memory cell for changing the state of the memory cell, wherein a pulse width of the output pulse is determined in accordance with the value retrieved from the query cell.

11. The system of claim 1, wherein the state change circuitry includes circuitry for changing the state of the memory cell to a predetermined erased state by erasing the memory cell in increments and verifying the state of the memory cell after each erasure increment.

12. The system of claim 1, wherein the query cell stores an analog value.

13. The system of claim 1, wherein the memory cell and the query cell are located in a memory device having a plurality of sub-arrays, wherein the memory cell and the query cell are both located in the same sub-array of the memory device.

14. The system of claim 1, wherein the state change circuitry includes circuitry for outputting one of an erase pulse and a programming pulse to the memory cell for changing the state of the memory cell, wherein a pulse amplitude of the output pulse is determined in accordance with the value retrieved from the query cell.

15. The system of claim 1, wherein the system is for changing the state of the memory cell from a current state to a desired state, wherein the state change circuitry includes circuitry for changing the current state of the memory cell in accordance with the value retrieved from the query cell, the current state of the memory cell, and the desired state of the memory cell.

16. A semiconductor device comprising:
logic circuitry; and
an embedded memory coupled to the logic circuitry, the embedded memory including:
a plurality of memory cells;
a plurality of query cells, each associated with one of the memory cells for storing a value representative of a characteristic rate of change in the state of the associated memory cell;
querying circuitry coupled to the query cells for retrieving the values stored therein; and
state change circuitry coupled to the memory cells and the querying circuitry for changing the states of the memory cells in accordance with the values retrieved from their associated query cells.

17. The semiconductor device of claim 16, wherein the logic circuitry comprises a processor device.

18. The semiconductor device of claim 16, wherein the embedded memory is selected from a group comprising a flash memory, an EEPROM memory, an EPROM memory, a PROM memory, a DRAM memory, and a multi-bit per cell memory.

19. The semiconductor device of claim 16, wherein each query cell is associated with only one of the memory cells.

20. A multi-bit per cell memory device comprising:
a plurality of multi-bit memory cells;
a plurality of query cells, each associated with one of the multi-bit memory cells for storing a value representative of a characteristic rate of change in the state of the associated multi-bit memory cell;
querying circuitry coupled to the query cells for retrieving the values stored therein; and
state change circuitry coupled to the multi-bit memory cells and the querying circuitry for changing the states of the multi-bit memory cells in accordance with the values retrieved from the respective query cells associated with the multi-bit memory cells.

21. The multi-bit per cell memory device of claim 20, wherein the multi-bit memory cells comprise non-volatile memory cells, each having a plurality of programmed states, wherein the state change circuitry comprises programming circuitry for programming each of the multi-bit memory cells to a selected programmed state in accordance with a data value selected for storage in the multi-bit memory cell and with the value retrieved from the query cell associated with the multi-bit memory cell.

22. The multi-bit per cell memory device of claim 21, wherein the non-volatile memory cells comprise flash memory cells.

23. A memory array comprising:
a plurality of memory cells; and
a plurality of query cells, each associated with one of the memory cells for storing a value representative of a characteristic rate of change in the state of the associated memory cell.

24. The memory array of claim 23, wherein the memory array includes a plurality of sub-arrays, wherein the memory cells and the query cells are all located in the same sub-array of the memory array.

25. A memory device comprising:
a plurality of memory cells;
a plurality of query cells, each associated with one of the memory cells for storing a value representative of a characteristic rate of change in the state of the associated memory cell;

querying circuitry coupled to the query cells for retrieving the values stored therein; and state change circuitry coupled to the memory cells and the querying circuitry for changing the states of the memory cells in accordance with the values retrieved from the respective query cells associated with the memory cells.

26. A flash memory comprising:

a plurality of flash memory cells;

a plurality of flash query cells, each associated with one of the flash memory cells for storing a value representative of a characteristic rate of change in the state of the associated flash memory cell;

querying circuitry coupled to the query cells for retrieving the values stored therein; and state change circuitry coupled to the flash memory cells and the querying circuitry for changing the states of the flash memory cells in accordance with the values retrieved from the respective query cells associated with the flash memory cells.

27. An electronic system comprising an input device, an output device, a memory device, and a processor device coupled to the input, output, and memory devices, at least one of the input, output, processor, and memory devices including a system for changing the state of a memory cell, the system comprising:

a query cell for storing a value representative of a characteristic rate of change in the state of the memory cell;

querying circuitry coupled to the query cell for retrieving the value stored therein; and state change circuitry coupled to the querying circuitry for changing the state of the memory cell in accordance with the value retrieved from the query cell.

28. The electronic system of claim 27, wherein the memory device comprises an embedded memory physically associated with one of the input, output, and processor devices.

29. A semiconductor substrate having a surface on which a system for changing the state of a memory cell is fabricated, the system comprising:

a query cell for storing a value representative of a characteristic rate of change in the state of the memory cell;

querying circuitry coupled to the query cell for retrieving the value stored therein; and state change circuitry coupled to the querying circuitry for changing the state of the memory cell in accordance with the value retrieved from the query cell.

30. The semiconductor substrate of claim 29, wherein the substrate comprises a semiconductor wafer.

31. A method of erasing a memory cell, the method comprising:

storing a value representative of a characteristic rate of erasure of the memory cell in a query cell associated with the memory cell;

retrieving the value stored in the query cell;

reading the state of the memory cell; and erasing the memory cell in accordance with the state thereof and the value retrieved from the query cell.

32. The method of claim 31, wherein the act of storing a value comprises storing a charge in the query cell associated with the memory cell.

33. The method of claim 31, wherein the act of storing a value comprises storing an analog value.

34. The method of claim 31, wherein the act of erasing the memory cell comprises outputting an erase pulse to the memory cell, with a pulse width of the erase pulse being determined in accordance with the state of the memory cell and the value retrieved from the query cell.

35. The method of claim 31, wherein the act of erasing the memory cell comprises outputting an erase pulse to the memory cell, with a pulse amplitude of the erase pulse being determined in accordance with the state of the memory cell and the value retrieved from the query cell.

36. The method of claim 31, wherein the act of erasing the memory cell begins while the act of retrieving the value stored in the query cell is occurring.

37. A method of programming a memory cell with a selected data bit, the method comprising:

storing a value representative of a characteristic rate of programming of the memory cell in a query cell associated with the memory cell;

retrieving the value stored in the query cell; and programming the memory cell in accordance with the selected data bit and the value retrieved from the query cell.

38. The method of claim 37, wherein the act of programming the memory cell comprises outputting a programming pulse to the memory cell, with a pulse width of the programming pulse being determined in accordance with the selected data bit and the value retrieved from the query cell.

39. The method of claim 37, wherein the act of programming the memory cell comprises outputting a programming pulse to the memory cell, with a pulse amplitude of the programming pulse being determined in accordance with the selected data bit and the value retrieved from the query cell.

40. The method of claim 37, wherein the act of programming the memory cell begins while the act of retrieving the value stored in the query cell is occurring.

41. A method of storing a characteristic rate of change in the state of a memory cell located in a memory device, the method comprising storing a value representative of the characteristic rate of change in the state of the memory cell in a query cell that is associated with the memory cell and is also located in the memory device.

42. A method of erasing a memory cell, the method consisting essentially of:

storing a value representative of a characteristic rate of erasure of the memory cell in a query cell associated with the memory cell;

retrieving the value stored in the query cell;

reading the state of the memory cell; and erasing the memory cell in accordance with the state thereof and the value retrieved from the query cell.

43. A method of programming a memory cell with a selected data bit, the method consisting essentially of:

storing a value representative of a characteristic rate of programming of the memory cell in a query cell associated with the memory cell;

retrieving the value stored in the query cell; and programming the memory cell in accordance with the selected data bit and the value retrieved from the query cell.

44. A method of changing the state of a memory cell from a current state to a desired state representative of one or more data bits awaiting storage in the memory cell, the method comprising:

storing a value representative of a characteristic rate of change in the state of the memory cell in a query cell associated with the memory cell;

retrieving the value stored in the query cell;

reading the current state of the memory cell; and changing the state of the memory cell in accordance with the value retrieved from the query cell, the current state of the memory cell, and the desired state of the memory cell so the memory cell stores the one or more data bits awaiting storage therein.

45. The method of claim 44, wherein the act of changing the state of the memory cell comprises one of programming and erasing the memory cell.

46. The method of claim 44, wherein the act of changing the state of the memory cell begins while the act of retrieving the value stored in the query cell is occurring.

47. A method of changing the state of a memory cell from a current state to a desired state without an interim erased state, the method comprising:

storing a value representative of a characteristic rate of change in the state of the memory cell in a query cell associated with the memory cell;

retrieving the value stored in the query cell;

reading the current state of the memory cell; and changing the state of the memory cell from the current state to the desired state in accordance with the value retrieved from the query cell, the current state of the memory cell read therefrom, and the desired state of the memory cell without an interim erased state.

48. A system for changing the state of a memory cell, the system comprising:

a flash cell for storing a value representative of a characteristic rate of change in the state of the memory cell;

querying circuitry coupled to the query cell for retrieving the value stored therein; and state change circuitry coupled to the querying circuitry for changing the state of the memory cell in accordance with the value retrieved from the query cell.

\* \* \* \* \*

UNITED STATES PATENT AND TRADEMARK OFFICE
CERTIFICATE OF CORRECTION

PATENT NO. : 6,188,613 B1
DATED : February 13, 2001
INVENTOR(S) : H. Montgomery Manning It is certified that error appears in the above-identified patent and that said Letters Patent is hereby corrected as shown below:

Column 7,
Line 29, change "include s" to -- includes --

Signed and Sealed this

Twenty-fifth Day of January, 2005

JON W. DUDAS
*Director of the United States Patent and Trademark Office*